(12) United States Patent
Bhattacharyya

(10) Patent No.: US 8,319,272 B2
(45) Date of Patent: Nov. 27, 2012

(54) SOLAR CELL SYSTEMS

(75) Inventor: Arup Bhattacharyya, Essex Junction, VT (US)

(73) Assignee: Micron Technology Inc., Boise, ID (US)

( * ) Notice: Subject to any disclaimer, the term of this patent is extended or adjusted under 35 U.S.C. 154(b) by 222 days.

(21) Appl. No.: 12/757,870

(22) Filed: Apr. 9, 2010

(65) Prior Publication Data

US 2010/0193032 A1 Aug. 5, 2010

Related U.S. Application Data

(60) Continuation of application No. 11/787,541, filed on Apr. 16, 2007, now Pat. No. 7,723,166, which is a division of application No. 10/989,648, filed on Nov. 15, 2004, now Pat. No. 7,687,402.

(51) Int. Cl.
*H01L 29/388* (2006.01)
*H01L 31/042* (2006.01)
(52) U.S. Cl. ........ 257/317; 257/318; 257/431; 257/433; 438/149; 438/308; 136/252; 136/261
(58) Field of Classification Search .................. 257/317, 257/318, 431, 433; 438/149, 308; 136/251, 136/252, 261
See application file for complete search history.

(56) References Cited

U.S. PATENT DOCUMENTS

| | | | |
|---|---|---|---|
| 4,870,470 A | 9/1989 | Bass, Jr. et al. | |
| 5,160,987 A | 11/1992 | Pricer et al. | |
| 5,583,368 A * | 12/1996 | Kenney | 257/621 |
| 5,811,870 A | 9/1998 | Bhattacharyya et al. | |
| 6,344,373 B1 | 2/2002 | Bhattacharyya et al. | |
| 6,465,786 B1 | 10/2002 | Rhodes | |
| 6,586,833 B2 * | 7/2003 | Baliga | 257/712 |
| 6,593,624 B2 | 7/2003 | Walker | |
| 6,700,771 B2 | 3/2004 | Bhattacharyya | |
| 6,713,810 B1 | 3/2004 | Bhattacharyya | |
| 2003/0042534 A1 * | 3/2003 | Bhattacharyya | 257/317 |
| 2003/0057439 A1 | 3/2003 | Fitzgerald | |
| 2003/0151948 A1 | 8/2003 | Bhattacharyya | |
| 2003/0178693 A1 | 9/2003 | Bhattacharyya et al. | |
| 2004/0041206 A1 | 3/2004 | Bhattacharyya | |

OTHER PUBLICATIONS

Aceves, M. et al., "Duality Metal Oxide Semiconductor-PN Junction in the Al/Silicon Rich Oxide/Si Structure as a Radiation Sensor", Thin Solid Films 373 (2000), pp. 134-136.
Guha, S. et al., "Amorphous Silicon Alloy Photovoltaic Technology—From R&D to Production", Mat. Res. Soc. Symp. Proc. vol. 336 (1994 Materials Research Society), pp. 645-655.
Coates, K. et al., "Deposition of Silicon Nitride to Improve the Conversion Efficiency of Multicrystalline Silicon Solar Cells", Proceed. of 16th Eur. Photovoltaic Solar Energy Conf., Glasgow (2000), p. 1279, 3 pgs.
Irene, E. et al., "On the Nature of CVD Si-Rich SiO2 and Si8N4 Films", J. Elec. Soc., vol. 127, No. 11 (Nov. 1980), pp. 2518-2521.
Mendez, J., et al., "Electronic Model of a Surge Suppressor Made of Silicon Rich Oxide (SRO) and Silicon", 2000 IEEE Microelec. Reliability and Qualif. Workshop (Oct. 31-Nov. 1, 2000), 2 pgs.

* cited by examiner

*Primary Examiner* — Howard Weiss
*Assistant Examiner* — Steven Rao
(74) *Attorney, Agent, or Firm* — Wells St. John P.S.

(57) ABSTRACT

The invention includes optoelectronic devices containing one or more layers of semiconductor-enriched insulator (with exemplary semiconductor-enriched insulator being silicon-enriched silicon oxide and silicon-enriched silicon nitride), and includes solar cells containing one or more layers of semiconductor-enriched insulator. The invention also includes methods of forming optoelectronic devices and solar cells.

8 Claims, 4 Drawing Sheets

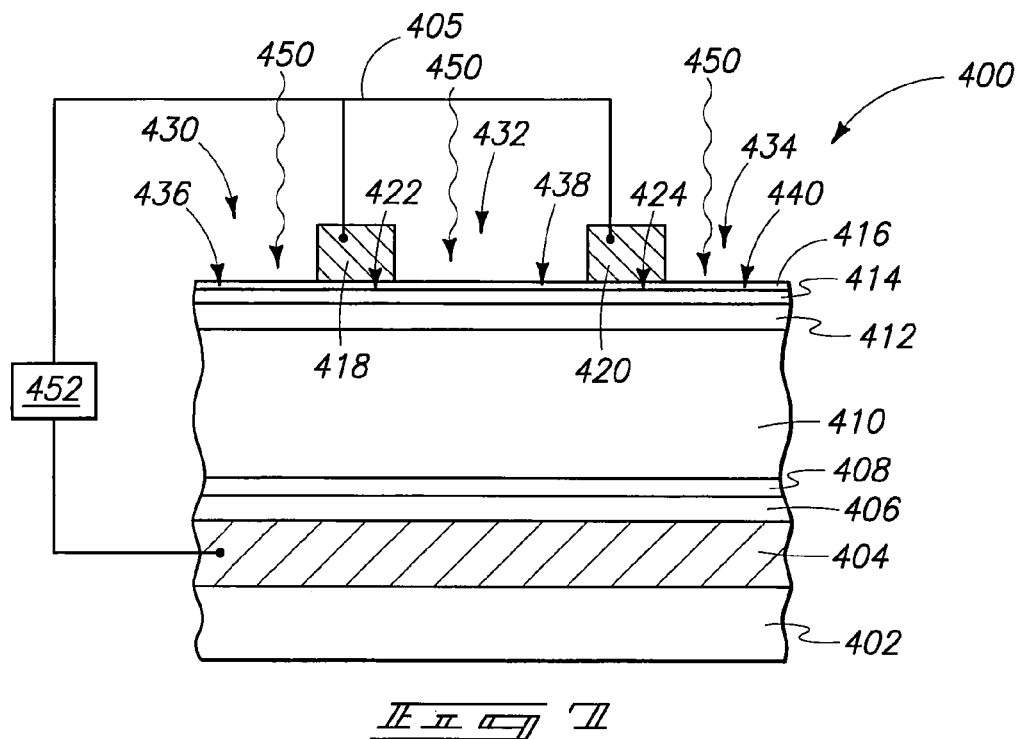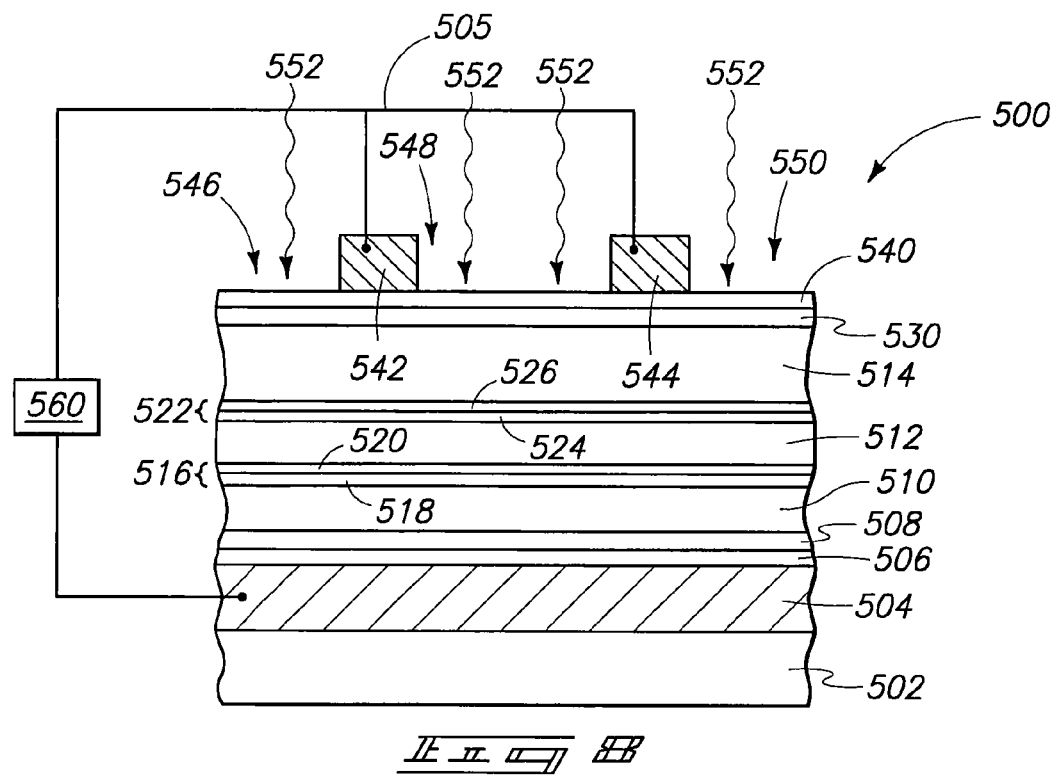

SOLAR CELL SYSTEMS

RELATED PATENT DATA

This patent resulted from continuation application of U.S. patent application Ser. No. 11/787,541, which was filed Apr. 16, 2007, and which is hereby incorporated herein by reference; which resulted from a divisional application of U.S. patent application Ser. No. 10/989,648, which was filed Nov. 15, 2004, which issued as U.S. Pat. No. 7,687,402, and which is hereby incorporated herein by reference.

TECHNICAL FIELD

The invention pertains to optoelectronic devices and solar cells, and pertains to methods of making optoelectronic devices and solar cells.

BACKGROUND OF THE INVENTION

Optoelectronic devices (i.e., devices which detect electromagnetic radiation) have numerous applications. For instance, optoelectronic devices can be utilized as photodetectors in cameras and other imaging equipment. A continuing goal is to decrease the size and complexity of optoelectronic devices, while increasing robustness of the devices. Accordingly, it is desired to develop improved optoelectronic devices.

Solar cells (i.e., cells which convert electromagnetic radiation into electrical energy) also have numerous applications. For instance, solar cells can be utilized for providing energy in remote locations, and/or can be utilized to alleviate dependence on other power sources (such as, for example, batteries, petroleum, etc.). A continuing goal is to reduce the cost, size and/or complexity of solar devices, while maintaining, and preferably improving, robustness of the devices. Accordingly, it is desired to develop improved solar cells. Although the term "solar cell" refers to "solar" and thus implies that it is configured to work with sunlight, the term "solar cell" is utilized in the art to refer generically to devices which convert electromagnetic radiation from any source (sunlight or otherwise) to electrical energy. The term "solar cell" is utilized herein to refer to devices which convert electromagnetic radiation from any source (sunlight or otherwise) into electrical energy, and is to be understood to be broad enough to include devices which convert light from regions of the electromagnetic spectrum outside of the wavelengths primarily associated with sunlight.

SUMMARY OF THE INVENTION

In one aspect, the invention includes an optoelectronic device. The device comprises a first electrode, a first layer of semiconductor material over the first electrode, a second layer of semiconductor material over the first layer of semiconductor material, a layer of semiconductor-enriched insulator over the second layer of semiconductor material, and a second electrode over the layer of semiconductor-enriched insulator. The second electrode has at least one window extending therethrough to a portion of the layer of semiconductor-enriched insulator. The first layer of semiconductor material is heavily-doped semiconductor material, and the second layer of semiconductor material is either essentially undoped or doped to a lower concentration of dopant than the first layer of semiconductor material.

In particular aspects, the first layer of semiconductor material of the above-described optoelectronic device can be heavily n-type doped semiconductor material, and the second layer of semiconductor material can be lightly n-type doped semiconductor material. Also, in particular aspects, the semiconductor-enriched insulator can comprise one or both of silicon-enriched silicon oxide and silicon-enriched silicon nitride.

In one aspect, the invention encompasses an optoelectronic device comprising a semiconductor substrate lightly doped with a first type of dopant and comprising a defined body region of the device. The device includes a gate stack over the body region, with the gate stack containing a layer of semiconductor-enriched insulator and containing a covering material over the semiconductor-enriched insulator. The covering material is at least partially transparent to one or more wavelengths of light that are to be detected by the device. The optoelectronic device further comprises a pair of source/drain regions within the semiconductor substrate and operatively proximate the gate stack and body region. The source/drain regions are heavily doped with a second type of dopant. One of the first and second types of dopant is n-type and the other is p-type.

In one aspect, the invention includes a solar cell. The solar cell comprises a first electrode, a first layer of semiconductor material over the first electrode, a second layer of semiconductor material over the first layer of semiconductor material, a layer of semiconductor-enriched insulator over the second layer of semiconductor material, a second electrode extending over one or more segments of the layer of semiconductor-enriched insulator, and one or more windows over one or more segments of the layer of semiconductor-enriched insulator. The one or more windows permit one or more wavelengths of electromagnetic radiation to reach segments of the layer of semiconductor-enriched insulator beneath the windows. The first layer of semiconductor material is heavily-doped with a first dopant type, and the second layer of semiconductor material is lightly-doped with the first dopant type.

In one aspect, the invention encompasses a solar cell which includes a first electrode, a first layer of semiconductor material over the first electrode, a plurality of light-detecting regions over the first layer of semiconductor material (for example, three light-detecting regions can be provided in exemplary aspects of the invention), a layer of semiconductor-enriched insulator over the plurality of light-detecting regions, a second electrode extending over segments of the layer of semiconductor-enriched insulator, and one or more windows which permit electromagnetic radiation to reach the semiconductor-enriched insulator. In exemplary aspects in which three light-detecting regions are utilized, a first of the three light-detecting regions can be a stack of amorphous silicon and amorphous silicon-germanium, a second of the light-detecting regions can be another stack of amorphous silicon and amorphous silicon-germanium, and a third of the light-detecting regions can be amorphous silicon without any substantial concentration of germanium. The amorphous silicon-germanium of the first stack can have a different atomic concentration of germanium than the amorphous silicon-germanium of the second stack. The first layer of semiconductor material can be either heavily n-type doped or heavily p-type doped; and the layer of semiconductor-enriched insulator can comprise one or both of silicon-enriched silicon oxide and silicon-enriched silicon nitride.

The invention also includes methods of forming optoelectronic devices, and methods of forming solar cells.

BRIEF DESCRIPTION OF THE DRAWINGS

Preferred embodiments of the invention are described below with reference to the following accompanying drawings.

FIG. 7 is a diagrammatic, fragmentary, cross-sectional view of a solar cell in accordance with yet another aspect of the present invention.

FIG. 8 is a diagrammatic, cross-sectional, fragmentary view of a solar cell in accordance with yet another aspect of the present invention.

DETAILED DESCRIPTION OF THE PREFERRED EMBODIMENTS

Figure 1:
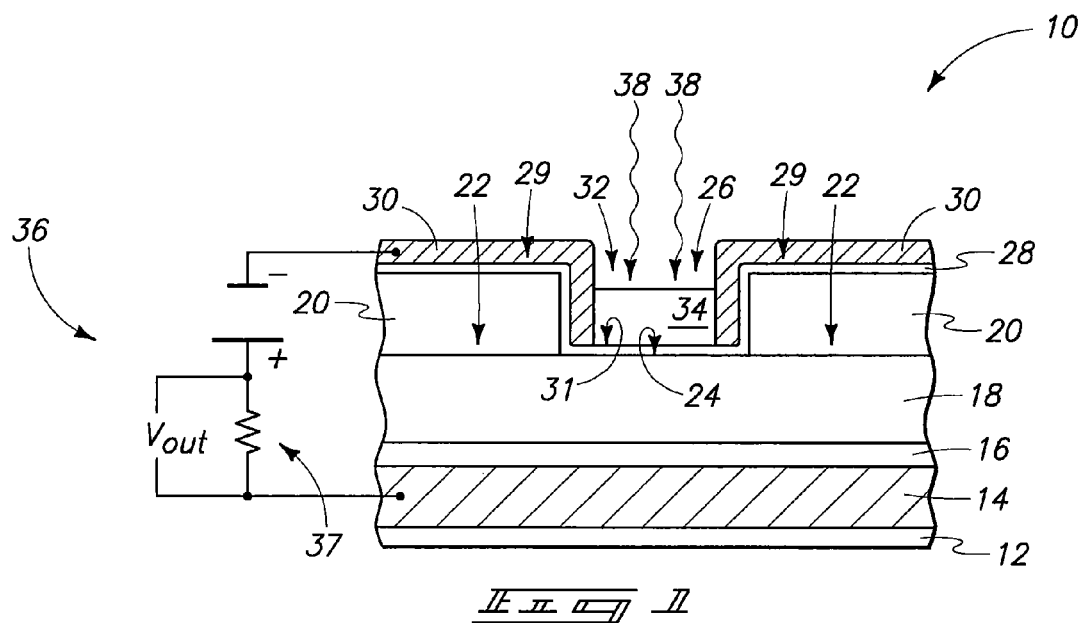
FIG. 1 is a diagrammatic, fragmentary, cross-sectional view of an optoelectronic device in accordance with one aspect of the present invention.

This disclosure of the invention is submitted in furtherance of the constitutional purposes of the U.S. Patent Laws "to promote the progress of science and useful arts" (Article 1, Section 8).

Structures containing stacks of metal/semiconductor-enriched insulator/semiconductor can behave like semiconductor junction diodes if appropriate compositions of semiconductor-enriched insulator are employed. Such characteristics of semiconductor-enriched insulators can be exploited in combination with various electrical and optical properties of the materials to form optoelectronic devices and solar cells.

The semiconductor-enriched insulator family of materials includes silicon-enriched insulator materials, such as silicon-enriched silicon oxide and silicon-enriched silicon nitride. A silicon-enriched silicon nitride can, for example, comprise from about 1 atomic percent excess silicon to about 20 atomic percent excess silicon as measured relative to $Si_3N_4$; and a silicon-enriched silicon oxide can, for example, comprise from about 1 atomic percent excess silicon to about 20 atomic percent excess silicon, as measured relative to $SiO_2$. The amount of excess silicon can be measured by direct measurement of the silicon concentration, or alternatively can be measured by determining the refractive index of a silicon-enriched material. For instance, $Si_3N_4$ will have a refractive index of about 2, and silicon enrichment of the silicon nitride will increase the refractive index quantitatively, as is known to persons of ordinary skill in the art. Similarly, silicon dioxide ($SiO_2$) has a refractive index of about 1.5, and silicon enrichment of the silicon dioxide will alter the refractive index in a quantitative manner, as is known to persons of ordinary skill in the art. The semiconductor-enriched insulator family of materials also includes germanium-enriched insulator materials, such as, for example, germanium-enriched germanium nitride.

Semiconductor-enriched insulator materials tend to be multiphase materials, with the excess semiconductor material being present in a matrix of the dominate material. For instance, silicon-enriched silicon nitride will generally have a phase of silicon within a matrix of silicon nitride, and silicon-enriched silicon oxide will generally have a phase of silicon present within matrix of silicon dioxide. The physical properties of semiconductor-enriched insulator materials can enable the materials to be utilized for charge trapping, with silicon-enriched materials having from about 1 atomic % to about 20 atomic % excess silicon frequently being capable of a charge trapping density of from about 1% to about 10%.

In some aspects of the invention, the semiconductor layer of a stack of metal/semiconductor-enriched insulator/semiconductor (such as a stack of meta/silicon-enriched insulator/silicon) can be essentially undoped (i.e., can contain less than $1\times10^{17}$ atoms/cm$^3$ of dopant; in other aspects the semiconductor layer can be lightly doped (i.e., can contain from about $1\times10^{17}$ atoms/cm$^3$ to about $1\times10^{20}$ atoms/cm$^3$ of dopant); and in yet other aspects the semiconductor layer can be heavily doped (i.e., can contain greater than about $1\times10^{20}$ atoms/cm$^3$ of dopant).

The semiconductor-enriched insulators utilized in the various aspects of the invention described herein can be formed by any suitable methodology. In some aspects, such insulators can be formed utilizing low pressure chemical vapor deposition (LPCVD) technology, or plasma enhanced chemical vapor deposition (PECVD) technology. Deposition temperatures are typically from about 700° C. to about 800° C. for LPCVD, and from about 200° C. to about 400° C. for PECVD. In alternative aspects, electron-cyclotron-resonance plasma enhanced CVD processes (ECR-PECVD) can be utilized for forming semiconductor-enriched insulators. Such technology can enable the semiconductor-enriched insulators to be formed with excellent physical/electrical properties during deposition at room temperature, or near room temperature, followed by a rapid thermal anneal. The ECR-PECVD process can be particularly useful for forming optoelectronics and/or solar cells when low temperature processing is desired.

Appropriate control of the deposition conditions utilized to form semiconductor-enriched insulators can enable control of various physical properties of the insulator composition. For instance, appropriate control of the deposition conditions utilized to form silicon-enriched insulators can enable the concentration, size and distribution of excess silicon to be controlled. Various properties of silicon-enriched insulators, such as, for example, refractive index, dielectric permittivity, optical absorption, electrical conductivity, charge trapping characteristics (trap density/trap depth) can be reproducibly and widely altered by controlling the composition (i.e., the amount of silicon enrichment) within the films.

Frequently, silicon-enriched silicon nitride films are found to have superior characteristics in terms of interface control, thermal stability, device reproducibility, and radiation hardness as compared to silicon-enriched silicon oxide films. Accordingly, it can be preferable that the devices described herein be formed utilizing silicon-enriched silicon nitride films. It is to be understood, however, that silicon-enriched oxide films can also be utilized in the devices, and further that other semiconductor-enriched insulator materials can be utilized, including, for example, germanium-rich materials and silicon-germanium rich materials. In some aspects, it can be advantageous to utilize a material comprising, consisting essentially of, or consisting of germanium-enriched germanium nitride for detecting infrared radiation.

Electrical conductivity of silicon-enriched silicon nitride films can be varied by several orders of magnitude by controlling the concentration of excess silicon (and accordingly the refractive index) of such films. At low excess silicon concentration, the conductivity approaches that of silicon nitride ($Si_3N_4$), whereas at high silicon concentrations the materials behave like semiconductors. Similarly, optical properties (for example a refractive index) are also altered by the concentration of excess silicon. The relationship between refractive index and silicon/nitrogen ratio, of silicon rich nitride films is published, as is the relationship between current density (J) versus electric field (E) for different silicon/nitrogen ratios of silicon nitride films. Other semiconductor-enriched materials, including, for example, silicon-enriched silicon oxide, also have physical properties which can be varied by controlling the concentration of excess semiconductor within the materials.

In particular aspects, the invention pertains to optoelectronic devices and methods of forming such devices. Such aspects are discussed with reference to FIGS. 1-4. In other aspects, the invention pertains to solar cells and methods of forming solar cells. Such aspects are discussed with reference to FIGS. 5-8.

Referring initially to FIG. 1, an exemplary optoelectronic device 10 is illustrated. Device 10 comprises a support structure, or base, 12. Such support structure can comprise any suitable material or combination of materials, including, for example, various polymers (such as plastic), glass, metal, etc.

A first electrode 14 is supported by base 12. First electrode 14 can comprise any suitable electrically conductive composition, or combination of compositions. In particular aspects, first electrode 14 will comprise, consist essentially of, or consist of one or both of silver and aluminum.

A layer 16 is over electrode 14, and in the shown aspect is in direct physical contact with a surface of electrode 14. Layer 16 comprises semiconductor material, and in particular aspects will be heavily doped. For instance, layer 16 can comprise, consist essentially of, or consist of heavily-doped silicon, heavily-doped germanium, or heavily-doped silicon-germanium. The heavy dopant concentration within layer 16 will typically correspond to n-type dopant (such as, for example, phosphorous), but it is to be understood that the invention encompasses other aspects (discussed below) in which the dopant type can be p-type.

Construction 10 comprises a layer 18 over layer 16. Layer 18 corresponds to a layer of semiconductor material, and in some aspects layers 16 and 18 can be referred to as a first layer of semiconductor material and a second layer of semiconductor material, respectively, to distinguish the layers from one another. Layer 18 is shown to be thicker than layer 16, but it is to be understood that the relative thicknesses of layers 16 and 18 can vary so that layers 16 and 18 are about the same thicknesses as one another, or so that layer 16 is thicker than layer 18.

Second layer 18 can comprise essentially undoped semiconductor material, or can comprise doped semiconductor material. Typically, to the extent that layer 18 comprises any dopant, the layer will have a lower concentration of dopant than first layer 16. If layer 18 is doped, the dopant type within layer 18 can match that within layer 16. Accordingly, layer 16 can correspond to heavily n-type doped semiconductor material and layer 18 can correspond to lightly n-type doped semiconductor material. In particular aspects, layer 16 can comprise, consist essentially of, or consist of heavily n-type doped silicon and layer 18 can comprise, consist essentially of, or consist of lightly n-type doped silicon; and in other aspects, layer 16 can comprise, consist essentially of, or consist of heavily n-type doped germanium and layer 18 can comprise, consist essentially of, or consist of lightly n-type doped germanium; and in yet other aspects layer 16 can comprise, consist essentially of, or consist of heavily n-type doped silicon-germanium and layer 18 can comprise, consist essentially of, or consist of lightly n-type doped silicon-germanium.

An electrically insulative material 20 is over second semiconductor layer 18 and patterned to cover a portion 22 of layer 18 while not covering a portion 24 of layer 18. More specifically, insulative material 20 is patterned to have an opening 26 extending therethrough and to an upper surface of layer 18.

Insulative material 20 can comprise, consist essentially of, or consist of any suitable material or combination of materials, including, for example, silicon dioxide.

A layer 28 of semiconductor-enriched insulator is provided over insulative material 20 and within opening 26. The layer 28 of semiconductor-enriched insulator is shown to be in direct physical contact with an upper surface of second semiconductor layer 18 within the opening 26. Layer 28 can, in particular aspects, correspond to a silicon-enriched insulator. In some aspects, layer 28 can comprise, consist essentially of, or consist of silicon-enriched silicon nitride, and can comprise from about 1 atomic % excess silicon to about 20 atomic % excess silicon relative to $Si_3N_4$. Alternatively, layer 28 can comprise, consist essentially of, or consist of silicon-enriched silicon oxide, and can comprise from about 1 atomic % excess silicon to about 20 atomic % excess silicon relative to $SiO_2$. In yet other aspects, layer 28 can correspond to a mixture of silicon-enriched silicon nitride and silicon-enriched silicon oxide. Layer 28 can have any suitable thickness, and in particular aspects will have a thickness of from about 10 nanometers to about 50 nanometers. In the shown aspect, layer 28 can be considered to have a portion over insulative material 20 and spaced from layer 18 by the insulative material 20, and to have another portion directly against layer 18.

A second electrode 30 is over semiconductor-enriched insulator 28. Second electrode 30 is patterned so that the second electrode is over a first portion of semiconductor-enriched insulator 28, and has a window 32 extending therethrough to a second portion of semiconductor-enriched insulator 28. The first portion of semiconductor-enriched insulator 28 is diagrammatically labeled as 29, and the second portion of semiconductor-enriched insulator 28 is diagrammatically labeled as 31.

Second electrode 30 can comprise any suitable electrically conductive composition or combination of compositions. In particular aspects, second electrode 30 will comprise the same composition as first electrode 14, and in other aspects second electrode 30 will comprise a different composition than first electrode 14. In exemplary aspects, second electrode 30 can comprise one or both of silver and aluminum.

An antireflective material 34 is provided within window 32 and over the second portion 31 of semiconductor-rich insulator 28. Antireflective material 34 can, for example, comprise, consist essentially of, or consist of indium tin oxide (ITO). The antireflective coating can be utilized to enhance the absorption efficiency of incident photon flux.

Circuitry 36 is shown provided to electrically bias second electrode 30 relative to first electrode 14. Specifically, the circuitry is shown biasing the second electrode to a negative potential relative to the first electrode. Such bias assumes that the conductively-doped material of layers 16 and 18 is n-type doped. If the semiconductor material of layers 16 and 18 is p-type doped, the shown bias of circuitry 36 will typically be reversed so that second electrode 30 would have a positive potential relative to first electrode 14. However, it is generally preferred that n-type doping be utilized in devices of the type diagrammatically illustrated as device 10, and accordingly it is generally preferred that circuit 36 be provided to negatively bias second electrode 30 relative to first electrode 14.

Electromagnetic radiation 38 is diagrammatically illustrated as being directed toward device 10, and specifically as entering window 32. The electromagnetic radiation can interact with semiconductor-enriched material 18 to cause charge separation to occur, which can be detected as a change in electrical properties by circuit 36. Accordingly, device 10 can be utilized to detect electromagnetic radiation. More specifically, when light having an energy greater than the $E_g$ of the semiconductor material of layer 28 impacts the diode comprising layer 28, the light gets absorbed into the depletion layer of silicon below the silicon-semiconductor rich semiconductor interface, and electron-hole pairs are generated. Electrons get collected at the positively-biased bottom electrode, and holes get collected at the negatively-biased top electrode. Thus, a photocurrent is generated which flows externally through the load resistor of circuit 36 (labeled as 37) to generate an output voltage ($V_{out}$).

The particular wavelengths of radiation detected by device 10 can be influenced by, among other things, the composition of material 34, the composition of material 28, the semiconductor material utilized for layer 18 and/or layer 16, and the dopant type and concentration utilized in layer 18 and/or layer 16. For instance, material 34 can be chosen to be relatively transparent to particular wavelengths of light, and non-transparent to other wavelengths of light so that the material 34 functions as a filter to determine which wavelengths of light will be detected by device 10. Alternatively, or additionally, the compositions of layers 16, 18 and 28 can be chosen so that device 10 is more sensitive to particular wavelengths of light than to others. Accordingly, device 10 can be configured as an optoelectronic device having sensitivity for particular desired wavelengths of electromagnetic radiation.

The discussion above assumes that second electrode 30 is relatively opaque to the wavelength of radiation detected by device 10. It is to be understood, however, that material 30 can, in some aspects, be at least partially transparent to such radiation. In such aspects, window 32 is defined by the location where semiconductor-enriched layer 28 is closely proximate layer 18 (and in the shown aspect directly physically contacts layer 18) as opposed to regions where layer 28 is spaced from layer 18 by the relatively thick intervening material 20.

Figure 2:
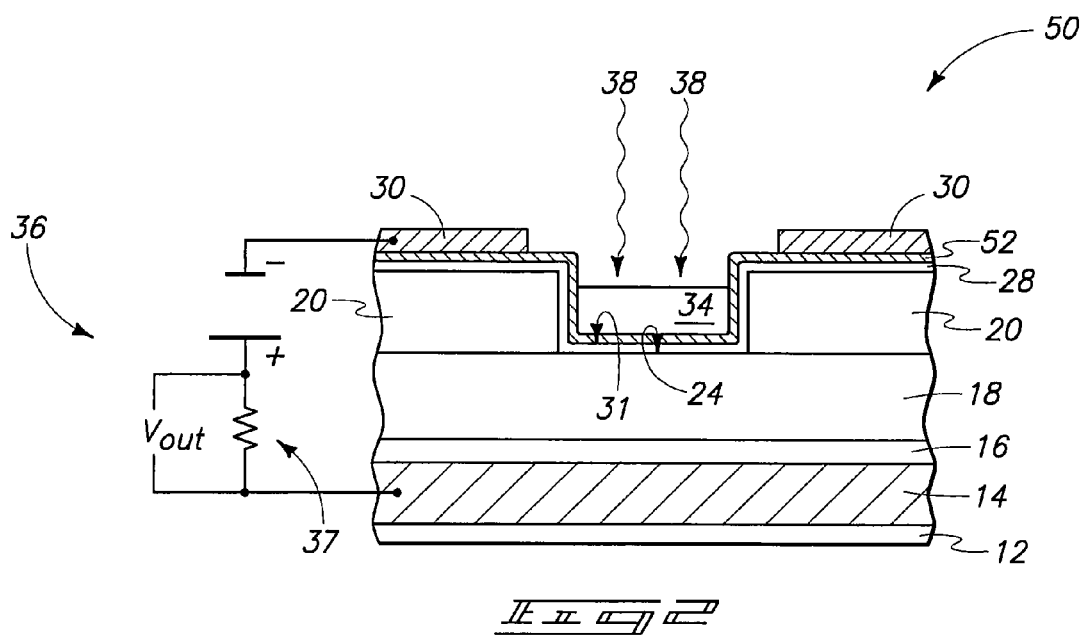
FIG. 2 is a diagrammatic, fragmentary, cross-sectional view of an optoelectronic device in accordance with another aspect of the present invention.

FIG. 2 shows an optoelectronic device 50 illustrating another embodiment of the present invention. In referring to device 50, similar numbering will be used as was utilized above in describing the device 10 of FIG. 1, where appropriate.

Device 50 comprises the base 12, first electrode 14, first and second semiconductor layers 16 and 18, insulative material 20 and semiconductor-enriched material 28 described previously. Device 50 also comprises the circuitry 36 described above with reference to FIG. 1.

Device 50 comprises the second electrode 30 and antireflective material 34 discussed above with reference to device 10 of FIG. 1. The second electrode 30 of FIG. 2 is shown patterned differently than that of FIG. 1, and specifically is shown not extending into the opening within insulative material 20 of the FIG. 2 embodiment of the invention.

Device 50 comprises a thin electrically conductive layer 52 over semiconductor-enriched material 28. Layer 52 can correspond to a metal-containing material, and in particular aspects can be considered a film of metal-containing material. Layer 52 can have a thickness of, for example, approximately 10 nanometers, and can be optically transparent to the particular wavelengths of electromagnetic radiation desired to be detected with device 50. In particular aspects, film 52 can comprise, consist essentially of, or consist of one or both of gold and aluminum. Layer 52 is shown extending over portions of semiconductor-enriched layer 28 within a window exposed to electromagnetic radiation 38, as well as over portions of layer 28 which are not within such window (i.e., portions covered by second electrode 30).

Antireflective material 34 of the FIG. 2 embodiment of the invention can comprise silicon nitride, zinc sulfide (ZnS) and/or zirconium oxide ($ZrO_2$) either in addition to ITO, or in place of ITO. In operation, the thin layer of optically transparent metal film 52 can be used as a conducting element for the top electrode 30.

Figure 3:
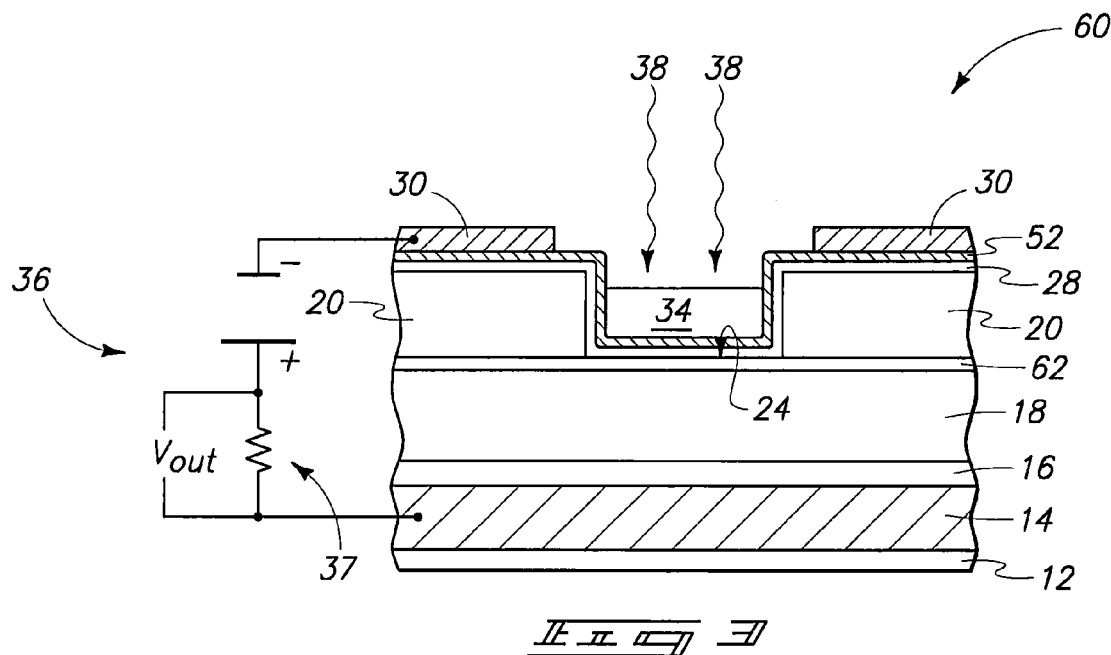
FIG. 3 is a diagrammatic, cross-sectional view of an optoelectronic device in accordance with yet another aspect of the present invention.

FIG. 3 shows an optoelectronic device 60 in accordance with yet another aspect of the invention. The device 60 of FIG. 3 is identical to the device 50 described with reference to FIG. 2 in all respects except that a layer 62 is provided between semiconductor-enriched insulator 28 and the second semiconductor layer 18. In the shown aspect of the invention, layer 62 is in direct physical contact with both layer 28 and layer 18, with layers 18 and 28 being on opposing sides of layer 62 relative to one another. Layer 62 can comprise semiconductor material, and can be referred to as a third layer of semiconductor material to distinguish layer 62 from the layers 16 and 18 described previously.

In particular aspects, device 60 is configured for detecting infrared radiation. In such aspects, layer 16 comprises, consists essentially of, or consists of heavily n-type doped germanium; and layer 18 comprises, consists essentially of, or consists of undoped germanium or n-type doped germanium. If layer 18 is n-type doped germanium, the dopant concentration within layer 18 will typically be less than that within layer 16. Layer 62 comprises, consists essentially of, or consists of either undoped silicon or n-type doped silicon. The silicon of layer 62 is relaxed, in the sense that the silicon has a crystallographic orientation compatible with that of the underlying germanium material, as opposed to a strained configuration in which the silicon would have a crystallographic orientation less compatible with the underlying germanium material. Although the dopant described as being utilized with layer 16, 18 and 62 is n-type dopant, it is to be understood that p-type dopant can be utilized in other aspects of the invention.

The cutoff wavelength for a device having a configuration of device 60 can be extended to about 1.9 micrometers, which can provide efficient infrared photodetection in the wavelength range of light of from about 700 nanometers to about 1700 nanometers, with good response time.

The devices described above with reference to FIGS. 1-3 are exemplary devices, and it is to be understood that the invention encompasses various modifications which are not shown. For instance, additional semiconductor layers can be provided in addition to the layers 16, 18 and 62. Also, additional antireflective materials can be provided in addition to, or alternatively to, the shown material 34. For instance, material 34 can correspond to a stack of antireflective materials. As another example, an antireflective material can be provided between semiconductor-enriched layer 28 and conductive layer 52 in the embodiments of FIGS. 2 and 3.

The semiconductor-enriched insulative material 28 of the above-described optoelectronic devices of FIGS. 1-3 functions similarly to a p-i-n diode (where "i" is an intrinsic or undoped layer of semiconductor), or a metal-insulator-semiconductor diode, or a metal-semiconductor diode. Since there is no p-n junction, the diode of the present can have several intrinsic advantages relative to prior art diodes. Such advantages can include, for example, scalability, very low leakage and therefore low power, high quantum efficiency, low noise, and fast response time (greater than $10^{-10}$ seconds) similar to metal-semiconductor diodes. Additionally, high density and low temperature processing can provide potential low costs. Application of the photodiodes of the present invention can be utilized primarily in the ultraviolet and visible ranges, or can be utilized for efficient infrared detection, particularly if the semiconductor material of layers 16 and/or 18 comprises germanium in addition to, or instead of silicon.

Figure 4:
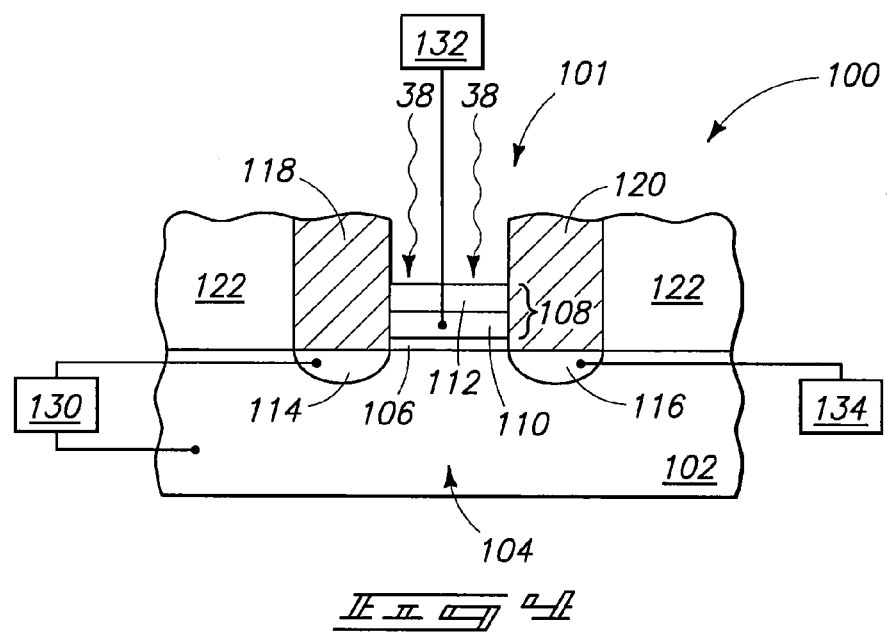
FIG. 4 is a diagrammatic, fragmentary, cross-sectional view of an optoelectronic device in accordance with yet another aspect of the present invention.

FIG. 4 shows a fragment 100 comprising an optoelectronic device 101 illustrating another aspect of the invention.

Fragment 100 includes a semiconductor substrate 102 lightly doped with a first type of dopant. The lightly-doped semiconductor substrate comprises a body region of the optoelectronic device, with such body region being diagrammatically illustrated as extending generally around the location labeled 104. Substrate 102 can comprise any suitable semiconductor material, and in particular aspects will comprise, consist essentially of, or consist of lightly-doped silicon. The dopant utilized for the light doping of substrate 102 can be either n-type or p-type, and in typical applications will be p-type. Suitable p-type dopant which can be utilized is one or both of indium and boron. In particular aspects, a substantial entirety of the dopant within the body region will be both indium and boron, with the term "substantial entirety" indicating that the only dopants within the body region are indium and boron within the tolerances of a process utilized to form the body region.

A dielectric material 106 is over the body region. Dielectric material 106 can, for example, comprise, consist essentially of, or consist of silicon dioxide.

A gate stack 108 is over the dielectric material. Gate stack 108 comprises a semiconductor-enriched insulator 110 and a covering material 112 over the semiconductor-enriched insulator. Semiconductor-enriched insulator 110 will typically comprise a silicon-enriched insulator, and specifically will typically comprise one or both of silicon-enriched silicon oxide and silicon-enriched silicon nitride. Covering material 112 will correspond to a material at least partially transparent to one or more wavelengths of light which are to be detected by the optoelectronic device. In particular aspects, device 101 is configured for detecting infrared radiation, and in such aspects covering material 112 can comprise, consist essentially of, or consist of one or both of indium tin oxide and silicon nitride ($Si_3N_4$).

To the extent that the semiconductor-enriched material 110 comprises silicon-enriched silicon oxide or silicon-enriched silicon nitride, the material can be from about 1 atomic % enriched in silicon to about 20 atomic % enriched in silicon.

A pair of heavily-doped regions 114 and 116 extend within substrate 102, and are operatively proximate the gate stack 108 and body region 104 of device 101 to enable the device to detect electromagnetic radiation. Heavily-doped regions 114 and 116 will be oppositely doped relative to the lightly-doped body region surrounding regions 114 and 116. Accordingly, if body region 104 comprises p-type doped semiconductor material, heavily-doped regions 114 and 116 will be n-type doped, and vice versa.

In some aspects, regions 114 and 116 can be referred to as source/drain regions, in that regions 114 and 116, together with gate stack 108, form a type of transistor device.

A pair of conductive pedestals 118 and 120 are provided to extend from regions 114 and 116, respectively, to allow interconnection of regions 114 and 116 to circuitry external of the shown device 101 (such circuitry is not shown).

An insulating material 122 is provided around device 101 to electrically isolate device 101 from other circuitry (not shown) which may be adjacent device 101. Insulating material 122 can comprise any suitable material, or combination of materials, and in particular aspects will comprise, consist essentially of, or consist of silicon dioxide.

Heavily-doped region 114 and body region 104 are shown to both be electrically connected to ground 130. Semiconductor-enriched layer 110 is electrically coupled with a first voltage 132, and heavily-doped region 116 is electrically coupled with a second voltage 134. Voltages 132 and 134 are different from ground, and generally will be different from one another.

The various layers and materials of device 101 can be formed to any suitable thicknesses. Typically, dielectric layer 106 will have a thickness of from about 4 to about 5 nanometers, semiconductor-enriched insulator 110 will have a thickness of from about 10 to about 30 nanometers, and the light-transmissive overcoat 112 will have a thickness of greater than about 30 nanometers.

Optoelectronic device 101 can be referred to as a phototransistor. The transistor action can enable device 101 to achieve a significantly higher gain than can photodiodes, although the response time for the phototransistor will typically be slower than the response time of photodiodes.

In operation, infrared radiation 38 (i.e., radiation having a wavelength of from about 2 micrometers to about 7 micrometers) photo-ionizes indium centers and generates excess holes in the body region 104 of substrate 102. Such lowers the threshold of the phototransistor 101, and accordingly alters channel conductance. The change in the channel conductance can be detected through circuitry coupled to device 101 to indicate the presence of infrared radiation, and in particular aspects to quantitate the amount of infrared radiation.

Figure 5:
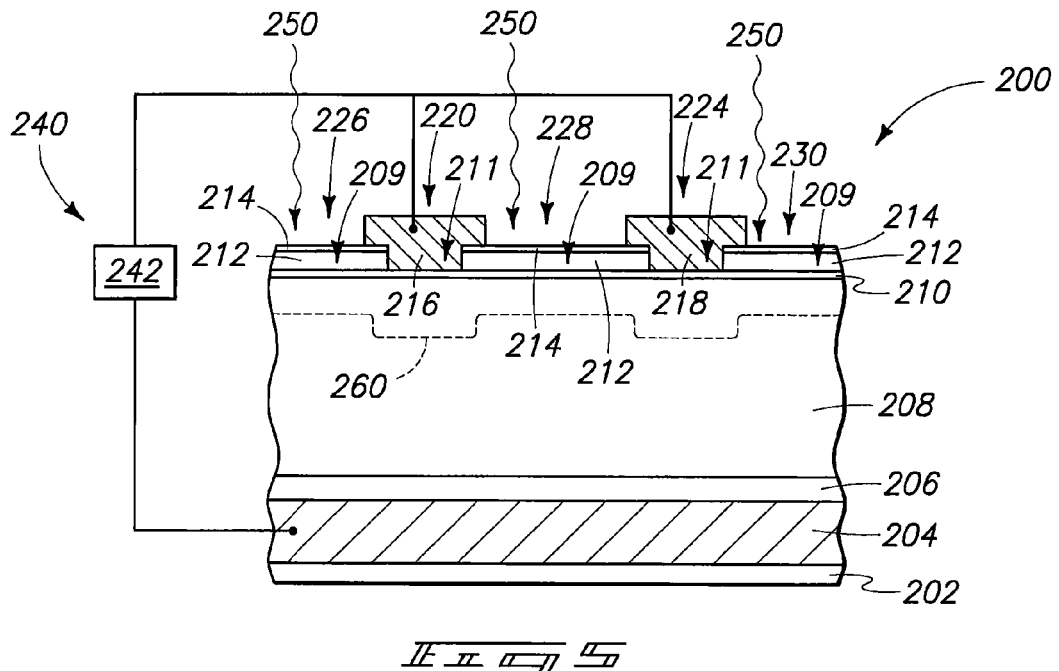
FIG. 5 is a diagrammatic, cross-sectional, fragmentary view of a solar cell in accordance with an aspect of the present invention.

Referring next to FIG. 5, such illustrates an exemplary embodiment of a solar cell 200 configured in accordance with an aspect of the present invention. The solar cell is supported by a base 202. Such base can comprise any suitable material or combination of materials, including, for example, glass, polymer (such as plastic) or metal (such as, for example, steel).

A first electrode 204 is over the base. The first electrode can comprise any suitable electrically conductive material, or combination of materials. In particular aspects, the first electrode will comprise, consist essentially of, or consist of one or both of silver and aluminum.

A first layer 206 of semiconductor material is over the first electrode 204, and a second layer 208 of semiconductor material is over the first layer 206. The first layer 206 is heavily doped with a first dopant type, and the second layer 208 is lightly doped with the first dopant type. The layer 206 can comprise, consist essentially of, or consist of conductively-doped silicon, conductively-doped germanium, or conductively-doped silicon-germanium. Similarly, the second semiconductor layer 208 can comprise, consist essentially of, or consist of conductively-doped silicon, conductively-doped germanium, or conductively-doped silicon-germanium. The first dopant type can be either n-type or p-type. In the exemplary embodiment, the first dopant type is p-type.

A layer 210 of semiconductor-enriched insulator is over the second layer 208 of semiconductor material. The semiconductor-enriched insulator can be a silicon-enriched insulator, and in particular aspects can comprise, consist essentially of, or consist of one or both of silicon-enriched silicon oxide and silicon-enriched silicon nitride. If the silicon-enriched insulator corresponds to silicon-enriched silicon nitride, such can comprise from about 1 atomic % excess silicon to about 20 atomic % excess silicon, with the excess silicon being measured relative to $Si_3N_4$. If the silicon-enriched insulator corresponds to silicon-enriched silicon oxide, such can comprise from about 1 atomic % excess silicon to about 20 atomic % excess silicon, with the excess silicon being measured relative to $SiO_2$.

The layer 210 can function as a tunnel medium during operation of the solar cell, and preferably has a thickness of from about 1 nanometer to about 100 nanometers. The layer 210 also acts as comprising carrier generation centers wherein electron-hole pairs are created. Additionally, the layer 210 can passivate the silicon surface to reduce recombination of high energy photo-generated electron-hole pairs near the interface of materials 208 and 210, which can enhance energy efficiency of the solar cell 200.

An antireflective material 212 is provided over layer 210. Layer 212 can have compositional aspects in common with semiconductor-enriched layer 210. As discussed previously, a semiconductor-enriched layer will typically comprise a matrix phase and an excess semiconductor phase. For instance, if layer 210 corresponds to silicon-enriched silicon nitride, it will typically comprise a phase of $Si_3N_4$, defining a matrix, and a phase of excess silicon within the matrix. Layer 212 can correspond to a composition having the same matrix as layer 210. Accordingly, if layer 210 corresponds to silicon-enriched silicon nitride, layer 212 can comprise silicon nitride, and in particular aspects will consist essentially of, or consist of silicon nitride. The layer 212 can serve as an efficient transmitter of incident solar radiation. In some aspects, layers 210 and 212 can both comprise silicon-enriched silicon nitride, with layer 212 having less silicon enrichment than layer 210. For instance, layer 210 can correspond to silicon-enriched silicon nitride having a refractory index of from about 2.5 to about 3, and layer 212 can correspond to a silicon-nitride-containing material having a refractive index of from about 2.0 to about 2.1.

In the shown aspect of the invention, layer 212 is patterned to have openings extending therethrough to the underlying layer 210. Accordingly, layer 212 is shown to be in direct physical contact with various segments 209 of layer 210, and to not be indirect physical contact with other segments 211 of layer 210. The segments 211 can be considered to define bottom peripheries of the openings extending through layer 212. Fingers (or stripes) of top electrode, such as 216 and 218 make direct contact to segments 211 of layer 210.

A second antireflective material 214 is provided over layer 212. Antireflective material 214 can comprise, for example, indium tin oxide, or any other suitable antireflective material, and can be omitted in some aspects of the invention.

Second electrodes 216 and 218 are provided over semiconductor-enriched insulator 210 and in direct physical contact with segments 211 of the semiconductor-enriched insulator. The second electrodes can comprise the same composition as first electrode 204, or can comprise different compositions. In particular aspects, the first and second electrodes comprise one or both of silver and aluminum.

The shown second electrodes have been patterned into a pair of spaced blocks. Actually, the second electrodes would typically extend into and out of the plane of the shown cross-sectional view so that the electrodes would be stripes (or strips) along an upper surface of construction 200.

Gaps 226, 228 and 230 are between the spaced second electrodes. The gaps correspond to windows over segments of the semiconductor-enriched insulator 210. Such windows permit electromagnetic radiation to reach the segments of the semiconductor-enriched insulator within the windows. The electromagnetic radiation is diagrammatically illustrated as waves 250 in the diagram of FIG. 5.

In the shown aspect of the invention, a plurality of second electrodes are spaced over a single continuous first electrode 204. It is to be understood that the invention encompasses other aspects (not shown) in which multiple first electrodes are provided, as well as aspects in which only a single second electrode is utilized. Further, the shown aspect comprising a plurality of second electrodes can correspond to an aspect in which the electrodes appear to be separated in the cross-sectional view of FIG. 5, but join to one another at a location which is not visible in the view of FIG. 5 so that the apparent plurality of second electrodes is actually a single second electrode which has been split into the shown plurality of stripes.

Circuitry 240 is provided between first electrode 204, and second electrodes 216 and 218. The circuitry includes a device 452 configured to be powered by an electric field gradient generated between the first electrode and the second electrodes.

The thin layer of semiconductor-enriched insulator 210 can be deposited in the same process as the antireflective coating 212. Advantageously, the processing utilized to form the solar cell 200 of FIG. 5 can be accomplished with a series of blanket deposition steps, and a single photolithography step for top electrode stripe formation.

In operation, a depletion layer (diagrammatically illustrated by dashed-line 260) is generated within second semiconductor layer 208. Electromagnetic radiation generates electron-hole pairs within the silicon-enriched insulator region. Electrons can be separated from holes both within the silicon-enriched insulator region and within the depletion layer. The electrons migrate toward either the first electrode or the second electrodes, depending on the built-in potential on the respective electrodes. In an exemplary application, the electrons tunnel through the semiconductor-enriched insulator 210 and get collected by the top electrode stripes 216 and 218 when the semiconductor layer 208 is of p-type doped silicon (typically lightly-doped). A thin inversion layer is formed at the silicon/semiconductor-enriched insulator interface (i.e., the interface between layers 208 and 210) which can significantly reduce surface recombination. Holes are collected by the opposite electrode to that which collects electrons, and would be collected by the bottom electrode in the exemplary application in which electrons are collected by the top electrodes. The electric field gradient generated by the separation of the electrons and holes can be utilized to power electrical devices.

Figure 6:
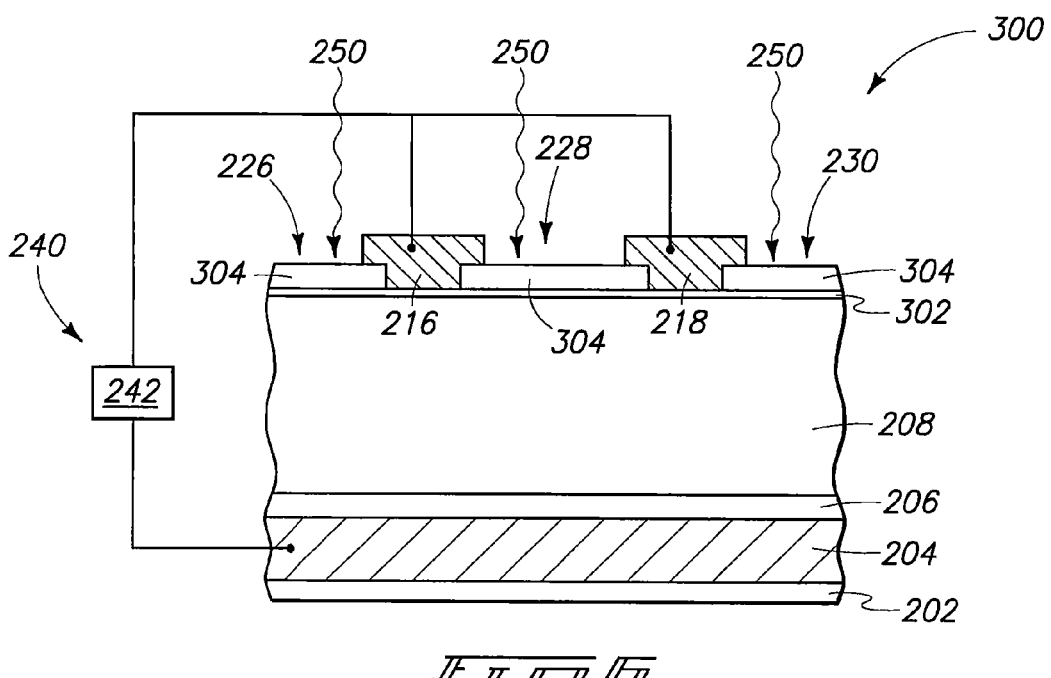
FIG. 6 is a diagrammatic, cross-sectional, fragmentary view of a solar cell in accordance with another aspect of the present invention.

FIG. 6 illustrates a solar cell 300 illustrating another aspect of the present invention. In referring to solar cell 300, similar numbering will be used as was utilized above in describing solar cell 200, where appropriate. Solar cell 300 comprises the base 202, first electrode 204, first layer of semiconductor material 206, second layer of semiconductor material 208, second electrodes 216 and 218, and circuitry 240 described previously. Construction 300 also comprises the windows 226, 228 and 230 extending between the second electrodes 216 and 218.

Construction 300 differs from the construction 200 of FIG. 5 in that construction 300 comprises a very thin dielectric material 302 in direct physical contact with the second layer 208 of semiconductor material, and comprises semiconductor-enriched insulator 304 over the dielectric material. As discussed above, layers 206 and 208 can be either n-type doped or p-type doped. In applications in which layers 206 and 208 are p-type doped, dielectric material 302 can comprise, consist essentially of, or consist of silicon dioxide ($SiO_2$); and in applications in which layers 206 and 208 are n-type doped, dielectric material 302 can comprise, consist essentially of, or consist of aluminum oxide ($Al_2O_3$).

In the shown aspect of the invention, dielectric material 302 is in direct physical contact with both semiconductor-enriched insulator 304 and second layer 208 of semiconductor material. Further, second electrodes 216 extend through openings in semiconductor-enriched layer 304 to physically contact an upper surface of dielectric material 302.

The semiconductor-enriched insulator 304 can comprise silicon-enriched insulator. In particular aspects, the semiconductor-enriched insulator 304 will comprise, consist essentially of, or consist of one or both of silicon-enriched silicon nitride and silicon-enriched silicon oxide.

The solar cells of FIGS. 5 and 6 are amenable to low-temperature processing (i.e., can be formed utilizing processing from about room temperature to about 300° C.) which can provide higher efficiency and cost reduction relative to high-temperature processes. The semiconductor material of layers 206 and 208 can comprise, for example, single crystal or polycrystalline silicon. The heavily-doped interface layer 206 can reduce series contact resistance and enhance light absorption.

The modification of the solar cell 300 of FIG. 6 relative to solar cell 200 of FIG. 5 creates a thin interface layer of dielectric material (which can be aluminum oxide or silicon dioxide in exemplary aspects of the invention) to reduce surface recombination and to enhance collection and thereby also enhance solar cell efficiency. A strong inversion layer is created in n-type silicon of layer 208 due to fixed negative charges in an aluminum layer 302. Similarly, fixed positive charges in silicon dioxide can create a strong inversion layer in p-type doped semiconductor material 208 to improve cell efficiency. It is noted that for the structures of FIGS. 5 and 6, cell efficiency can be possibly further improved by selecting a dual layer substrate of silicon/silicon-germanium (not shown) for layer 208. Such can enable the band gap in layer 208 to be varied from about 0.8 electron volts to about 1.1 electron volts, which may improve absorption efficiency of the electromagnetic radiation spectrum.

Another exemplary solar cell is illustrated as cell 400 in FIG. 7. Cell 400 comprises a base layer 402 which can comprise any suitable material or combination of materials, similar to the base layer 202 described previously.

Solar cell 400 comprises a first electrode 404 supported by the base layer. First electrode 404 can comprise any suitable electrically conductive composition or combination of compositions, and in particular aspects will comprise, consist essentially of, or consist of one or both of aluminum and silver.

A textured buffer layer 406 is over the first electrode. Textured buffer layer 406 can, for example, comprise, consist essentially of, or consist of a relatively transparent conductive oxide, such as, for example, zinc oxide.

A first layer 408 of semiconductor material is over textured buffered layer 406, a second layer 410 of semiconductor material is over first layer 408, and a third layer 412 of semiconductor material is over second layer 410. First layer 408 is heavily-doped with either p-type dopant or n-type dopant, and can comprise, consist essentially of, or consist of doped silicon or doped silicon-germanium. Layers 410 and 412 can be essentially undoped with conductivity-enhancing dopant. In particular aspects, one of layers 410 and 412 comprises consists essentially of, or consists of, silicon without any substantial concentration of germanium (i.e., silicon with less than 0.5 atomic percent germanium, and frequently with no detectable germanium), and the other comprises silicon-germanium. In particular aspects, one of layers 410 and 412 consists essentially of, or consists of silicon and the other consists essentially of or consists of silicon-germanium. The silicon and/or germanium of layers 408, 410 and 412 can be amorphous in particular aspects of the invention. The layers comprising silicon in combination with germanium can comprise any suitable concentration of germanium. In particular aspects such layers will comprise from 1 atomic % germanium to 99 atomic % germanium; and, in some aspects, the layers will comprise from about 5 atomic % germanium to about 50 atomic % germanium.

Layer 408 is shown in direct physical contact with layer 406, and layer 406 is shown in direct physical contact with layer 404.

Although the illustrated solar cell 400 comprises three semiconductor layers 408, 410 and 412, it is to be understood that the invention encompasses other solar cell devices comprising more than three semiconductor layers or less than three semiconductor layers. For instance, the invention encompasses aspects in which one of the layers 410 and 412 is eliminated, and the remaining layer consists essentially of, or consists of either amorphous silicon or amorphous silicon-germanium.

A semiconductor-enriched insulator layer 414 is over the third layer 412 of semiconductor material, and is shown in direct physical contact with an upper surface of layer 412. Semiconductor-enriched insulator layer 414 can comprise any suitable semiconductor-enriched composition, and in particular aspects will comprise, consist essentially of, or consist of one or both of silicon-enriched silicon nitride and silicon-enriched silicon oxide. An exemplary silicon-enriched silicon nitride can comprise from about 1 atomic % excess silicon to about 20 atomic % excess silicon, relative to $Si_3N_4$; and an exemplary silicon-enriched silicon oxide can comprise from about 1 atomic % excess silicon to about 20 atomic % excess silicon relative to $SiO_2$.

An antireflective material 416 is provided over layer 414, and in the shown aspect of the invention is in direct physical contact with an upper surface of layer 414. Antireflective material 416 can comprise any suitable composition, and in particular aspects will comprise, consist essentially of, or consist of indium tin oxide.

Second electrodes 418 and 420 are over antireflective material 416, and in the shown aspect of the invention are in direct physical contact with an upper surface of antireflective material 416. Although two electrodes are shown, it is to be understood that the invention encompasses aspects utilizing more than two electrodes or utilizing only a single electrode. Further, it is to be understood that the shown two electrodes could join to one another at a location outside of the shown cross-sectional view so that electrodes 418 and 420 are portions of a common electrode. In the shown aspect, electrodes 418 and 420 are shown electrically connected to one another to form a common second electrode 405. Electrodes 418 and 420 can comprise any suitable composition, and in particular aspects will comprise, consist essentially, or consist of one or both of silver and aluminum.

Electrodes 418 and 420 are over segments 422 and 424, respectively, of semiconductor-enriched insulator 414. The electrodes are spaced from one another to form gaps 430, 432 and 434. Segments of semiconductor-enriched insulator 414 are beneath such gaps, and are labeled as 436, 438 and 440.

Gaps 430, 432 and 434 can be considered windows which allow one or more particular wavelengths of electromagnetic radiation to reach the segments 436, 438 and 440 of semiconductor-enriched insulator 414. The particular wavelengths of electromagnetic radiation which reach the semiconductor-enriched material 414 are wavelengths which can penetrate materials above semiconductor-enriched insulator 414 within the windows. In the shown aspect, such would be wavelengths which can penetrate antireflective material 416. In some aspects, the segments 422 and 424 blocked by second electrodes and 418 and 420 can be considered first segments, and the segments 436, 438 and 440 within the windows can be considered second segments of the semiconductor-enriched insulator.

In operation, electromagnetic radiation 450 generates electron-hole pairs through interaction with semiconductor-enriched material 414, as well as semiconductor materials 412 and 410. Such electron-hole pairs are separated by the electric field gradient of a depletion layer below 414 (not shown). Electrons and holes are subsequently drifted and collected at the top and bottom electrode 405 and 404, respectively, providing power to external circuitry (with such external circuitry being represented by block 452 in the diagram of FIG. 7).

The textured buffer layer 406 of solar cell 400 can enhance the efficiency of light trapping by the solar cell. Typical thicknesses for layers 408, 410 and 412 are from about 0.1 micron to about 1 micron, and the relative thicknesses of the layers to one another can be anything suitable, including the exemplary shown relative thicknesses or other relative thicknesses.

All of the processing steps utilized to form the structure of FIG. 7 can advantageously be performed in a temperature range of from room temperature to about 250° C., which can be advantageous for achieving high efficiency and low cost of a fabrication process.

Another exemplary solar cell is shown in FIG. 8 as a solar cell 500. Such solar cell is supported over a base 502 which can have a similar composition to the base 402 discussed above with reference to FIG. 7.

The solar cell 500 comprises a first electrode 504 over base 502, and comprises a textured buffer layer 506 over the first electrode and shown in direct physical contact with the first electrode. Textured buffer layer 506 can comprise the same compositions discussed above for textured buffer layer 406 of the FIG. 7 construction.

The solar cell 500 also includes a first layer 508 of semiconductor material over the textured buffer layer, and shown in direct physical contact with the textured buffer layer. Layer 508 can comprise, consist essentially of or consist of heavily-doped semiconductor material, such as, for example, heavily-doped silicon, heavily-doped germanium, or heavily-doped silicon-germanium. The heavily-doped semiconductor material can be in any suitable form, such as, for example, amorphous form. The heavily-doped material can be either n-type doped or p-type doped, and will typically be n-type doped.

Three light-detecting regions 510, 512 and 514 are provided over first semiconductor layer 508. Each of the light-detecting regions can be configured to have a different composition than the others of the light-detecting regions so that the specific light-detecting regions are configured to detect different wavelengths of light relative to one another. For instance, one of the light-detecting regions can be configured to detect blue light, another can be configured to detect green light, and another can be configured to detect red light and/or infrared light. It can be desired that the light-detecting regions configured to detect shorter wavelength light be above those configured to detect longer wavelength light, in that shorter wavelength light will generally not penetrate as well into a substrate (i.e., will generally not penetrate as deeply into a substrate) as will longer wavelength light. Although only three light-detecting regions are shown, it is to be understood that the invention encompasses aspects in which more than three light-detecting regions are utilized, and further it is to be understood that the invention can encompass aspects in which less than three light-detecting regions are utilized.

The various light-detecting regions can all comprise one or both of amorphous silicon and amorphous germanium, and can differ from one another in the relative concentrations of silicon and germanium. For instance, one of the light-detecting regions can consist essentially of, or consist of, amorphous silicon without any substantial concentration of germanium, and can thus be configured to detect primarily blue light. Another of the light-detecting regions can comprise amorphous silicon-germanium (i.e., can comprise a mixture of amorphous silicon and amorphous germanium), with the germanium concentration being from about 1 atomic % to about 10 atomic % so that the light-detecting region is configured for detecting green light. Yet another of the light-detecting regions could comprise amorphous silicon-germanium, with the germanium concentration being from greater than about 10 atomic % to less than or equal to about 45 atomic % so that the light-detecting region is configured for detecting red and/or infrared light. In such aspects, it can be advantageous that the light-detecting region configured for detecting blue light be the uppermost region 514 of solar cell 500, the light-detecting region configured for detecting green light be the middle region 512 of the solar cell, and the light-detecting region configured for detecting red and/or infrared light be the lower-most region 510 of the solar cell. The light-detecting regions comprising silicon-germanium can further comprise a layer of amorphous silicon stacked with the silicon-germanium. In such cases, the layer of amorphous silicon can be either above the silicon-germanium composition in the stack, or below the silicon-germanium composition in the stack. Also, it is to be understood that a single light-detecting region can comprise multiple layers of amorphous silicon and silicon-germanium stacked with one another.

In the shown aspect of the invention, light-detecting region 510 is separated from light-detecting region 512 by a first stack 516 of semiconductor materials 518 and 520; and second light-detecting region 512 is separated from third light-detecting region 514 by a second stack 522 of semiconductor materials 524 and 526. The first and second stacks of semiconductor materials can comprise an n-type doped semiconductor material in combination with a p-type doped semiconductor material. Specifically, the semiconductor materials 518 and 524 can be p-type doped semiconductor materials (such as, for example, p-type doped silicon), and the layers 520 and 526 can correspond to n-type doped semiconductor material (such as n-type doped silicon). In other words, layers 518, 520, 524 and 526 can comprise, consist essentially of, or consist of conductively-doped silicon. The silicon can be in any suitable form, including, for example, amorphous form. It can be advantageous that stacks 516 and 522 be configured to have a layer of n-type doped semiconductor material in combination with a layer of p-type doped semiconductor material, and it can be further advantageous that the layer of p-type doped semiconductor material be beneath the layer of n-type doped semiconductor material within the individual stacks. The stacks 516 and 522 provide depletion layers to separate electron-hole pairs generated from radiation absorbed in regions 510 and 512, respectively. Alternatively, the stacks 516 and 522 could be replaced by appropriate thicknesses of one or more silicon-rich insulators, similar to layer 530.

A layer of semiconductor-enriched insulator 530 is provided over the third light-detecting region 514, and in the shown aspect of the invention is in direct physical contact with an uppermost surface of the light-detecting region 514. Semiconductor-enriched insulator 530 can comprise, consist essentially of, or consist of silicon-enriched semiconductor in particular aspects of the invention. Specifically, the semiconductor-enriched insulator 530 can comprise, consist essentially of, or consist of one or both of silicon nitride and silicon oxide in particular aspects of the invention. If the semiconductor-enriched insulator corresponds to silicon-enriched silicon nitride, such can comprise from about 1 atomic % excess silicon to about 20 atomic % excess silicon, relative to $Si_3N_4$; and if the semiconductor-enriched insulator corresponds to silicon-enriched silicon oxide, such can comprise from about 1 atomic % excess silicon to about 20 atomic % excess silicon relative to $SiO_2$.

An antireflective material 540 is provided over semiconductor-enriched insulator 530. Antireflective material 540 can correspond to any suitable material, and in particular aspects will comprise, consist essentially of, or consist of indium tin oxide.

Second electrodes 542 and 544 are provided over the antireflective material 540. The second electrodes are spaced from one another, and can correspond to either a pair of entirely separate electrodes, or to portions of a common electrode which joins at a location outside of the shown cross-section of FIG. 8. In the shown aspect, electrodes 542 and 544 are shown electrically coupled with one another to form a common top electrode 505.

The spaced electrodes 542 and 544 have gaps 546, 548 and 550 beside them. Such gaps define windows where one or more particular wavelengths of electromagnetic radiation can reach underlying portions of semiconductor-enriched insulator 530. Specifically, second electrodes 542 and 544 block some segments of semiconductor-enriched insulator 530, while other segments of the semiconductor-enriched insulator are exposed within the gaps to radiation passing through the gaps. The electromagnetic radiation within the gaps is diagrammatically illustrated by waves 552.

In operation, the electromagnetic radiation passing into solar cell 550 generates electron-hole pairs in regions 530, 514, 512 and 510. Depletion layers below 530 and regions 522 and 516 separate electrons and holes from one another. Electrons and holes drifted by the electric field gradients collect at the opposite electrodes 505 and 504, respectively, providing power to external circuitry (shown diagrammatically in FIG. 8 as circuitry 560).

The solar cell of FIG. 8 advantageously can generate electricity from multiple components of a spectrum of white light (such as, for example, sunlight).

The light-detecting regions 510, 512 and 514 of the solar cell 500, as well as the intervening stacks 516 and 522, can all advantageously be deposited in the same process tool, and in some aspects the semiconductor-enriched material 530 can also be deposited in the same process tool. In particular aspects of the invention, all of the processing steps utilized to form the solar cell 500 of FIG. 8 can be conducted within a temperature range of from about room temperature to about 250° C.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A solar cell system for powering a device using electromagnetic radiation, comprising:
    a first electrode of a solar cell system;
    a first material over the first electrode, the first material being semiconductor material doped to a first dopant type;
    a second material over the first material; the second material being doped to the first dopant type, and having a lower concentration of dopant than the first material;
    a semiconductor-enriched insulator over the second material;
    a second electrode of the solar cell system partially covering the semiconductor-enriched insulator and leaving one or more regions of the semiconductor-enriched insulator uncovered;
    circuitry connected with the first and second electrodes; and
    wherein electromagnetic radiation reaches said one or more regions of the semiconductor-enriched insulator to generate voltage within the circuitry and power the device.

2. The solar cell system of claim 1 comprising a layer consisting essentially of indium tin oxide between the semiconductor-enriched insulator and the second electrode, the layer consisting essentially of indium tin oxide being in direct physical contact with both the semiconductor-enriched insulator and the second electrode.

3. The solar cell system of claim 1 wherein the first material is p-type doped.

4. The solar cell system of claim 3 wherein the first material comprises amorphous silicon.

5. The solar cell system of claim 3 wherein the first material comprises amorphous silicon-germanium.

6. The solar cell system of claim 1 wherein the semiconductor-enriched insulator comprises one or both of silicon-enriched silicon nitride and silicon-enriched silicon oxide.

7. A solar cell system for powering a device using electromagnetic radiation, comprising:
    a first electrode of a solar cell system;
    a first semiconductor material over the first electrode, the first semiconductor material being either heavily N-type doped or heavily p-type doped;
    a second semiconductor material over the first semiconductor material;
    a third semiconductor material over the second semiconductor material, the second and third semiconductor materials being compositionally different from one another, and being compositionally different from the first semiconductor material;
    a semiconductor-enriched insulator over the third semiconductor material;
    a second electrode of the solar cell system extending one or more first segments of the semiconductor-enriched insulator;
    circuitry connected with the first and second electrodes;
    one or more windows over one or more second segments of the semiconductor-enriched insulator, the one or more windows permitting electromagnetic radiation to reach said one or more second segments of the semiconductor-enriched insulator; and
    wherein the electromagnetic radiation passes through the one or more windows and into the second segments of the semiconductor-enriched insulator to generate voltage within the circuitry and power the device.

8. A solar cell system for powering a device using electromagnetic radiation, comprising:
    a first electrode of a solar cell system;
    a layer of zinc oxide over the first electrode;
    a first layer of semiconductor material over the layer of zinc oxide, the first layer of semiconductor material being either n-type doped or p-type doped;
    at least three light-detecting regions over the first layer of semiconductor material; a first of the three light-detecting regions comprising a first silicon-germanium composition, a second of the light-detecting regions comprising a second silicon-germanium composition, and a third of the light-detecting regions consisting essentially of amorphous silicon without any substantial concentration of germanium, the first silicon-germanium composition having a different atomic concentration of germanium than the second silicon-germanium composition;

a layer of semiconductor-enriched insulator over the three light detecting regions;

a second electrode of the solar cell system extending one or more first segments of the layer of semiconductor-enriched insulator;

circuitry connected with the first and second electrodes;

one or more windows over one or more second segments of the layer of semiconductor-enriched insulator, the one or more window permitting one or more particular wavelengths of electromagnetic radiation to reach said one or more second segments of the layer of semiconductor-enriched insulator; and the electromagnetic radiation passing through the one or more windows and into the second segments of the layer of semiconductor-enriched insulator to generate voltage and power the device.

* * * * *

UNITED STATES PATENT AND TRADEMARK OFFICE
CERTIFICATE OF CORRECTION

PATENT NO. : 8,319,272 B2
APPLICATION NO. : 12/757870
DATED : November 27, 2012
INVENTOR(S) : Arup Bhattacharyya It is certified that error appears in the above-identified patent and that said Letters Patent is hereby corrected as shown below:

On the title page, Item (56), in column 2, under "Other Publications", line 2, delete "A1/Silicon" and insert -- Al/Silicon --, therefor.

In the Claims

In column 18, line 35, in claim 7, delete "N-type" and insert -- n-type --, therefor.

Signed and Sealed this
Sixteenth Day of July, 2013

Teresa Stanek Rea
*Acting Director of the United States Patent and Trademark Office*